(12) United States Patent
Fukiage et al.

(10) Patent No.: US 9,892,909 B2
(45) Date of Patent: Feb. 13, 2018

(54) FILM FORMING METHOD AND FILM FORMING APPARATUS

(71) Applicant: TOKYO ELECTRON LIMITED, Tokyo (JP)

(72) Inventors: Noriaki Fukiage, Nirasaki (JP); Takayuki Karakawa, Narasaki (JP); Akihiro Kuribayashi, Nirasaki (JP); Jun Ogawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/379,526

(22) Filed: Dec. 15, 2016

(65) Prior Publication Data
US 2017/0186606 A1  Jun. 29, 2017

(30) Foreign Application Priority Data

Dec. 25, 2015 (JP) .................................. 2015-254324

(51) Int. Cl.
*H01L 21/02* (2006.01)
*H01L 21/687* (2006.01)
(Continued)

(52) U.S. Cl.
CPC .... *H01L 21/02274* (2013.01); *C23C 16/0209* (2013.01); *C23C 16/345* (2013.01); *C23C 16/45542* (2013.01); *C23C 16/45544* (2013.01); *H01L 21/0217* (2013.01); *H01L 21/0228* (2013.01); *H01L 21/68764* (2013.01)

(58) Field of Classification Search
CPC ........... H01L 21/02274; H01L 21/0217; H01L 21/0228; H01L 21/68764; C23C 16/0209; C23C 16/345; C23C 16/45542; C23C 16/45544

See application file for complete search history.

(56) References Cited

U.S. PATENT DOCUMENTS 9,564,312 B2 *  2/2017  Henri ................... H01L 21/0228
2004/0121085 A1 *  6/2004  Wang ....................... C23C 16/34
427/569

(Continued)

FOREIGN PATENT DOCUMENTS

WO    2013/137115 A1    9/2013

*Primary Examiner* — Karen Kusumakar
(74) *Attorney, Agent, or Firm* — Nath, Goldberg & Meyer; Jerald L. Meyer

(57) ABSTRACT

A film forming method for forming a silicon nitride film on a substrate within a vacuum container includes a first process of supplying a gas of a silicon raw material to the substrate to cause the silicon raw material gas to be adsorbed onto the substrate, a second process of subsequently supplying an ammonia gas to the substrate in a non-plasma-converted state to cause the ammonia gas to be physically adsorbed onto the substrate, a third process of subsequently forming a reaction product layer by supplying active species obtained by plasma-converting a plasma-forming gas for forming plasma to the substrate, thereby causing ammonia physically adsorbed onto the substrate to react with the silicon raw material, and forming the silicon nitride film by depositing the reaction product layer by repeating multiple times a cycle including the first process, the second process and the third process.

7 Claims, 13 Drawing Sheets

(51) Int. Cl.
*C23C 16/02* (2006.01)
*C23C 16/34* (2006.01)
*C23C 16/455* (2006.01)

(56) References Cited

U.S. PATENT DOCUMENTS

| | | | | |
|---|---|---|---|---|
| 2013/0337658 A1* | 12/2013 | Ikegawa | ............. | H01L 21/0262 438/782 |
| 2015/0162185 A1* | 6/2015 | Pore | .................... | H01L 21/0234 438/786 |
| 2016/0079054 A1* | 3/2016 | Chen | ................... | H01L 21/0228 438/762 |

* cited by examiner

FILM FORMING METHOD AND FILM FORMING APPARATUS

CROSS-REFERENCE TO RELATED APPLICATION

This application claims the benefit of Japanese Patent Application No. 2015-254324, filed on Dec. 25, 2015, in the Japan Patent Office, the disclosure of which is incorporated herein in its entirety by reference.

TECHNICAL FIELD

The present disclosure relates to a film forming method and a film forming apparatus for forming a silicon nitride film on a substrate.

BACKGROUND

In a semiconductor manufacturing process, there is often performed a film forming process in which a SiN (silicon nitride) film is formed on a substrate so as to cover a base film having a pattern such a hole, a groove or the like. In the related art, a film forming apparatus for performing formation of a SiN film in this way is known. According to this film forming apparatus, as a rotary table is rotated, a substrate mounted on the rotary table passes alternately and repeatedly through a region where a raw material gas containing silicon is supplied and a region where a nitriding gas for nitriding the raw material gas is plasma-converted and supplied. Thus, a SiN film is formed on the substrate.

There may be a case where, for example, a carbon film mainly composed of carbon, which is called a SOC film, is used as the base film mentioned above. However, if the base film is a carbon film, when an ammonia ($NH_3$) gas is used as the nitriding gas and a process is performed by plasma-converting the $NH_3$ gas, the carbon film is relatively heavily etched. Thus, film loss (film thickness reduction) occurs. In order to prevent such etching, it is conceivable to perform a process using a plasma-converted nitrogen ($N_2$) gas instead of a plasma-converted $NH_3$ gas. However, active species obtained by plasma-converting an $N_2$ gas are relatively rapidly deactivated. For that reason, there is a possibility that most of the active species fail to reach the lower portions of a hole and a groove of a carbon film. In this case, in the SiN film formed on the sidewall of the carbon film which forms a pattern, the film thickness at the lower side of the sidewall is smaller than the film thickness at the upper side of the sidewall. Thus, when forming the SiN film on the carbon film in which a pattern is formed, it is difficult to obtain good step coverage.

SUMMARY

Some embodiments of the present disclosure provide a technique for forming a silicon nitride film, which is capable of suppressing damage to a surface of a substrate and assuring high coverage with respect to the surface of the substrate.

According to one embodiment of the present disclosure, there is provided a film forming method for forming a silicon nitride film on a substrate within a vacuum container, including: a first process of supplying a gas of a silicon raw material to the substrate to cause the silicon raw material gas to be adsorbed onto the substrate; a second process of subsequently supplying an ammonia gas to the substrate in a non-plasma-converted state to cause the ammonia gas to be physically adsorbed onto the substrate; a third process of subsequently forming a reaction product layer by supplying active species obtained by plasma-converting a plasma-forming gas for forming plasma to the substrate, thereby causing ammonia physically adsorbed onto the substrate to react with the silicon raw material; and forming the silicon nitride film by depositing the reaction product layer by repeating multiple times a cycle including the first process, the second process and the third process.

According to another embodiment of the present disclosure, there is provided a film forming apparatus for forming a silicon nitride film on a substrate, including: a rotary table installed within a vacuum container and configured to revolve the substrate; a first process part configured to supply a gas of a silicon raw material to a substrate passage region on the rotary table; a second process part positioned at a rotational direction downstream side of the rotary table with respect to the first process part and separated from the first process part in order to restrain gases from being mixed with each other, the second process part configured to supply an ammonia gas in a non-plasma-converted state to the substrate passage region and configured to cause the ammonia gas to be physically adsorbed onto the substrate; and a third process part positioned at a rotational direction downstream side of the rotary table with respect to the second process part and separated from the first process part in order to restrain gases from being mixed with each other, the third process part configured to supply active species obtained by plasma-converting a plasma-forming gas for forming plasma to the substrate passage region.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
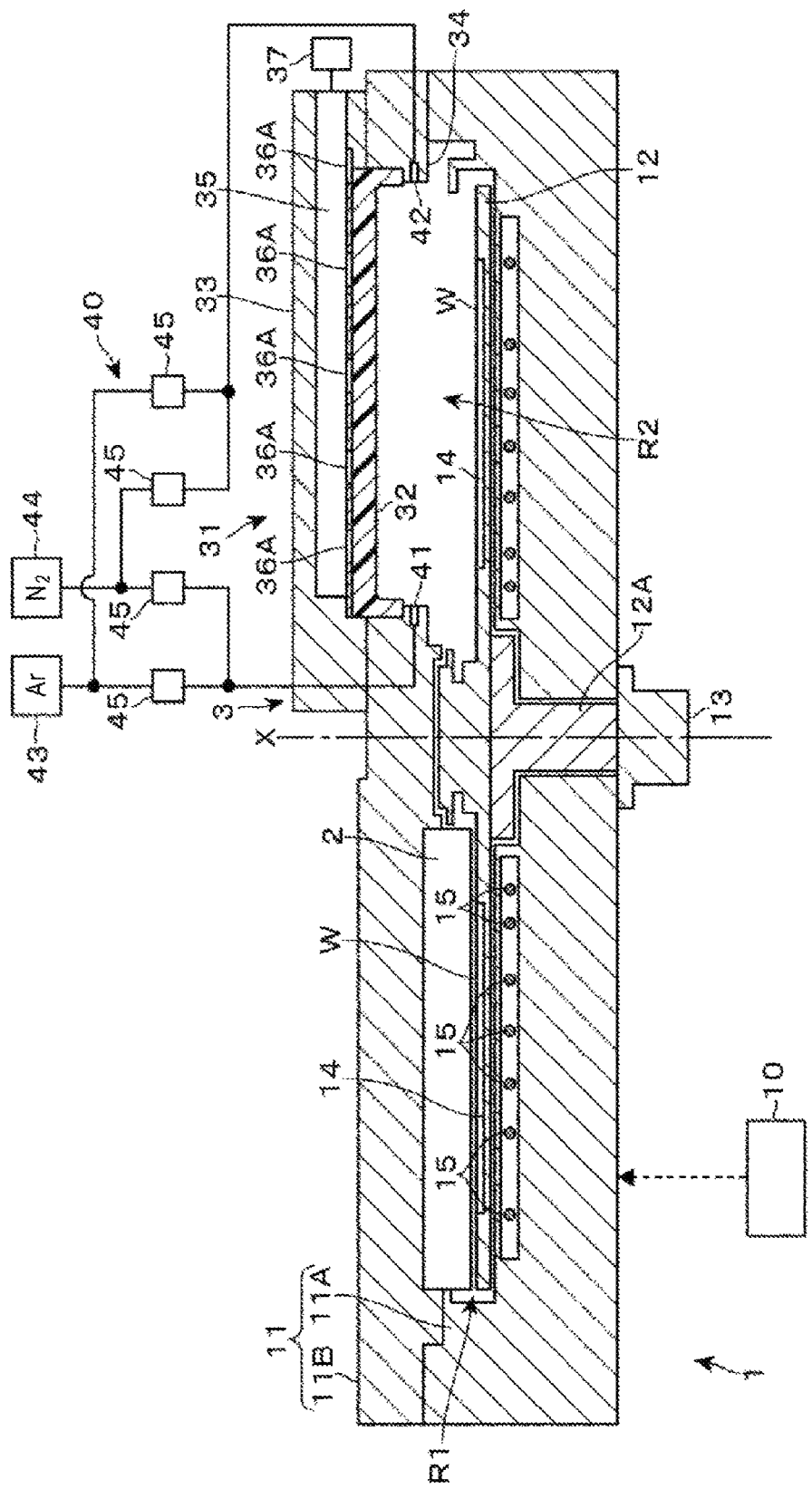
FIG. 1 is a schematic vertical sectional side view of a film forming apparatus for implementing a film forming method of the present disclosure.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

A film forming apparatus 1 according to an embodiment of the present disclosure will be described with reference to a vertical sectional side view of FIG. 1 and a horizontal sectional plane view of FIG. 2. The film forming apparatus 1 is configured to form a SiN film on a surface of a semiconductor wafer (hereinafter referred to as a wafer) W, which is a substrate, by ALD (Atomic Layer Deposition). In the present disclosure, silicon nitride will be referred to as SiN regardless of a stoichiometric proportion of Si and N. Accordingly, the term SiN includes $Si_3N_4$.

In the drawings, reference numeral 11 designates a vacuum container (process container) having a flat substantially-circular shape. The vacuum container 11 includes a container body 11A configured to define a sidewall and a bottom portion, and a top plate 11B. In the drawings, reference numeral 12 designates a circular rotary table horizontally installed within the vacuum container 11. In the drawings, reference numeral 12A designates a support part configured to support a central portion of a rear surface of the rotary table 12. In the drawings, reference numeral 13 designates a rotation mechanism. In a film forming process, the rotary table 12 is rotated clockwise in a plane view in a circumferential direction through the support part 12A. In the drawings, reference symbol X designates a rotation axis of the rotary table 12.

Five circular recess portions 14 are formed on an upper surface of the rotary table 12 along a circumferential direction (rotation direction) of the rotary table 12. Wafers W are accommodated within the respective recess portions 14. In other words, the respective wafers W are mounted on the rotary table 12 so that the wafers W are revolved by the rotation of the rotary table 12. In FIG. 1, reference numeral 15 designates heaters. The heaters 15 are concentrically installed in the bottom portion of the vacuum container 11 and are configured to heat the wafers W mounted on the rotary table 12. In FIG. 2, reference numeral 16 designates a wafer transfer gate formed in the sidewall of the vacuum container 11. The wafer transfer gate 16 can be opened and closed by a gate valve not shown. The wafers W are delivered between the outside of the vacuum container 11 and the inside of the recess portions 14 through the wafer transfer gate 16 by a substrate transfer mechanism not shown.

A gas supply/exhaust unit 2, a plasma formation unit 3, a gas supply unit 4B and a gas supply unit 4A are installed above the rotary table 12 in the named order toward the upstream side of the rotation direction of the rotary table 12 along the rotation direction. Hereinafter, the gas supply/exhaust unit 2 will be described with reference to FIG. 3 which is a vertical sectional side view and FIG. 4 which is a bottom view. In a plane view, the gas supply/exhaust unit 2 is formed in a fan-like shape so as to grow wider in the circumferential direction of the rotary table 12 from the center side of the rotary table 12 toward the peripheral edge side of the rotary table 12. The lower surface of the gas supply/exhaust unit 2 adjoins and faces the upper surface of the rotary table 12.

Raw material gas discharge holes 21, an exhaust hole 22 and a purge gas discharge hole 23 are formed on the lower surface of the gas supply/exhaust unit 2. The raw material gas discharge holes 21 are dispersedly disposed in a fan-shaped region 24 positioned more inward than the peripheral edge portion of the lower surface of the gas supply/exhaust unit 2. During the rotation of the rotary table 12 in the film forming process, the raw material gas discharge holes 21 discharge a DCS (dichlorosilane) gas, which is a Si (silicon)-containing raw material gas for the formation of a SiN film, downward in a shower-like manner and supply the DCS gas to the entire surfaces of the wafers W. The raw material gas is not limited to the DCS gas but may be, for example, a HCD (hexachlorodisilane) gas.

In the fan-shaped region 24, three zones 24A, 24B and 24C are defined from the center side of the rotary table 12 toward the peripheral edge side of the rotary table 12. Gas flow paths 25A, 25B and 25C partitioned from each other are formed in the gas supply/exhaust unit 2 so that the DCS gas can be independently supplied to the raw material gas discharge holes 21 formed in the zone 24A, the raw material gas discharge holes 21 formed in the zone 24B and the raw material gas discharge holes 21 formed in the zone 24C. The downstream ends of the gas flow paths 25A, 25B and 25C are respectively configured as the raw material gas discharge holes 21.

The upstream ends of the gas flow paths 25A, 25B and 25C are respectively connected to a DCS gas supply source 26 via pipes. Gas supply instruments 27 each including a valve and a mass flow controller are installed in the respective pipes. The supply and cutoff and the flow rate of the DCS gas supplied from the DCS gas supply source 26 toward the respective gas flow paths 25A, 25B and 25C are controlled by the gas supply instruments 27. Individual gas supply instruments other than the gas supply instruments 27, which will be described later, are also configured just like the gas supply instruments 27 so as to control the supply and cutoff and the flow rate of a gas flowing toward the downstream side.

Next, the exhaust hole 22 and the purge gas discharge hole 23 will be described. For the sake of easier understanding of the drawings, the exhaust hole 22 and the purge gas discharge hole 23 are indicated by multiple dots in FIG. 4. The exhaust hole 22 and the purge gas discharge hole 23 are annularly opened in the peripheral edge portion of the lower surface of the gas supply/exhaust unit 2 so as to surround the fan-shaped region 24 and so as to face the upper surface of the rotary table 12. The purge gas discharge hole 23 is positioned outside the exhaust hole 22. The region on the rotary table 12, which exists inward of the exhaust hole 22, constitutes a raw material gas adsorption region R1 as a first process part where the adsorption of DCS onto the surfaces of the wafers W is performed. The purge gas discharge hole 23 discharges an $N_2$ (nitrogen) gas as a purge gas toward the rotary table 12.

In the film forming process, the discharge of the raw material gas from the raw material gas discharge holes 21, the exhaust from the exhaust hole 22 and the discharge of the purge gas from the purge gas discharge hole 23 are simultaneously performed. Thus, as indicated by arrows in FIG. 3, the raw material gas and the purge gas discharged toward the rotary table 12 are moved toward the exhaust hole 22 along the upper surface of the rotary table 12 and are exhausted from the exhaust hole 22. By performing the discharge and exhaust of the purge gas in this way, the atmosphere of the raw material gas adsorption region R1 is separated from the external atmosphere. It is therefore possible to restrictively supply the raw material gas to the raw material gas adsorption region RE In other words, it is possible to restrain the DCS gas supplied to the raw material gas adsorption region R1 from being mixed with the respective gases and the active species of the gases supplied to the outside of the raw material gas adsorption region R1 by the plasma formation unit 3 and the gas supply units 4A and 4B as will be described later. This makes it possible to perform a film forming process with respect to the wafers W using ALD as will be described later. The purge gas serves not only to isolate the atmosphere as described above but also to remove the DCS gas excessively adsorbed onto the wafers W from the wafers W.

Figure 3:
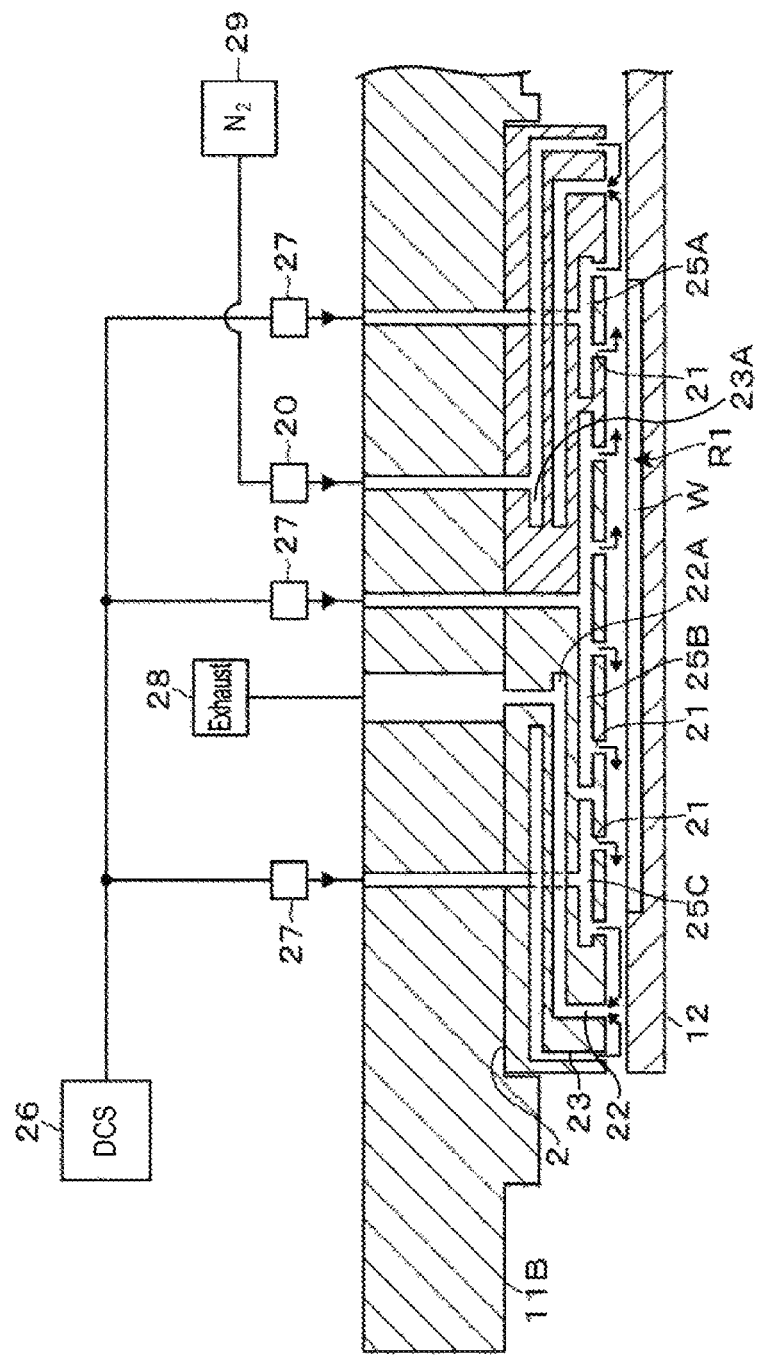
FIG. 3 is a vertical sectional side view of a gas supply/exhaust unit installed in the film forming apparatus.
Figure 4:
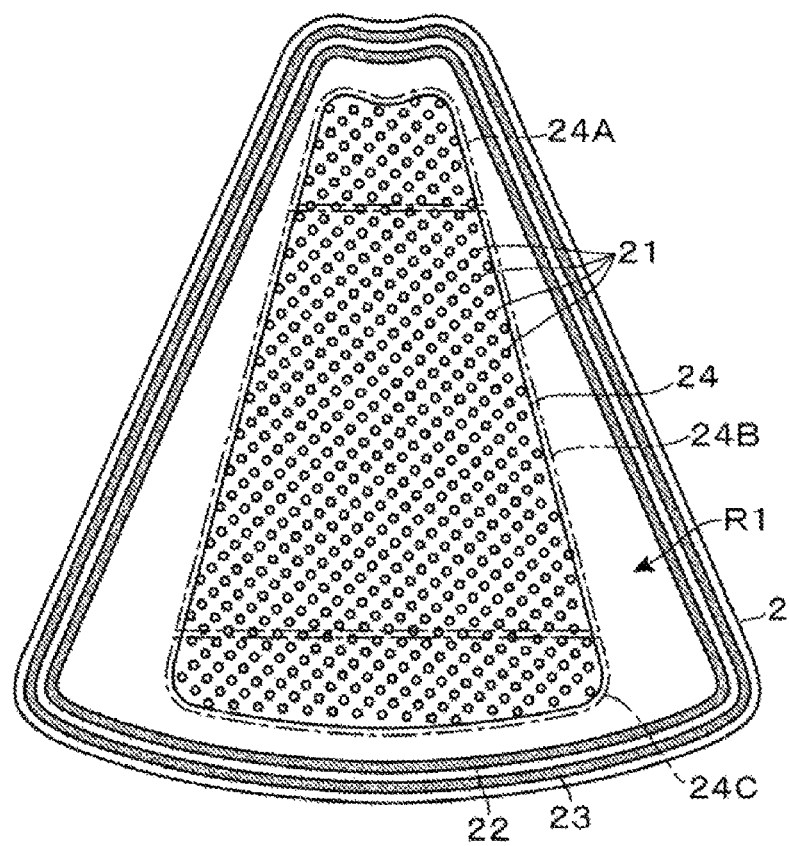
FIG. 4 is a bottom view of the gas supply/exhaust unit.

In FIG. 3, reference numerals 22A and 23A designate gas flow paths installed in the gas supply/exhaust unit 2 and partitioned from each other. The gas flow paths 22A and 23A are also partitioned with respect to the gas flow paths 25A, 25B and 25C. The upstream end of the gas flow path 22A is connected to the exhaust hole 22. The downstream end of the gas flow path 22A is connected to an exhaust device 28. The exhaust from the exhaust hole 22 can be performed by the exhaust device 28. Furthermore, the downstream end of the gas flow path 23A is connected to the purge gas discharge hole 23. The upstream end of the gas flow path 23A is connected to an $N_2$ gas supply source 29. A gas supply instrument 20 is installed in a pipe which interconnects the gas flow path 23A and the $N_2$ gas supply source 29.

Next, the plasma formation unit 3 will be described with reference to FIG. 1. The plasma formation unit 3 supplies a plasma-forming gas onto the rotary table 12, and generates plasma on the rotary table 12 by supplying a microwave to the plasma-forming gas. The plasma formation unit 3 includes an antenna 31 for supplying the microwave. The antenna 31 includes a dielectric plate 32 and a metal-made waveguide 33.

In a plane view, the dielectric plate 32 is formed in a substantially fan-like shape so as to grow wider from the center side of the rotary table 12 toward the peripheral edge side of the rotary table 12. In the top plate 11B of the vacuum container 11, a substantially fan-like through-hole is formed so as to correspond to the shape of the dielectric plate 32. In the inner circumferential surface of the lower end portion of the through-hole, a support portion 34 is formed so as to slightly protrude toward the center of the through-hole. The dielectric plate 32 is installed so as to close the through-hole from the upper side and so as to face the rotary table 12. The peripheral edge portion of the dielectric plate 32 is supported by the support portion 34.

The waveguide 33 is installed above the dielectric plate 32 and is provided with an internal space 35 extending in the radial direction of the rotary table 12. In the drawings, reference numeral 36 designates a slot plate that constitutes the lower portion of the waveguide 33. The slot plate 36 is installed so as to make contact with the dielectric plate 32 and is provided with a plurality of slots 36A. The end portion of the waveguide 33 existing at the center side of the rotary table 12 is closed. A microwave generator 37 is connected to the end portion of the waveguide 33 existing at the peripheral edge side of the rotary table 12. The microwave generator 37 supplies a microwave of, for example, about 2.45 GHz, to the waveguide 33.

Furthermore, the plasma formation unit 3 includes first gas discharge holes 41 and second gas discharge holes 42 configured to supply a plasma-forming gas toward the lower surface of the dielectric plate 32. The first gas discharge holes 41 and the second gas discharge hole 42 are formed in the support portion 34 of the dielectric plate 32, for example, in a plural number. The first gas discharge holes 41 discharge the plasma-forming gas from the center side of the rotary table 12 toward the peripheral edge side of the rotary table 12. The second gas discharge holes 42 discharge the plasma-forming gas from the peripheral edge side of the rotary table 12 toward the center side of the rotary table 12. The microwave supplied to the waveguide 33 passes through the slots 36A of the slot plate 36 and reaches the dielectric plate 32. The microwave is supplied to the plasma-forming gas discharged toward the lower side of the dielectric plate 32. Thus, plasma is restrictively formed in a region below the dielectric plate 32. The region where the plasma is formed constitutes a third process part. In FIG. 2, the region is designated by R2.

As the plasma-forming gas, it may be possible to use, for example, a mixed gas of an Ar (argon) gas which is an inert gas and an $N_2$ gas which is an inert gas. In the drawings, reference numeral 43 designates a supply source of an Ar gas. In the drawings, reference numeral 44 designates a supply source of an $N_2$ (nitrogen) gas. The first gas discharge holes 41 and the second gas discharge holes 42 are respectively connected to the Ar gas supply source 43 and the $N_2$ gas supply source 44 via a pipe system 40 provided with gas supply instruments 45. The pipe system 40 is configured to individually control the supply and cutoff and the flow rate of the Ar gas supplied from the Ar gas supply source 43 to the respective gas discharge holes 41 and 42 and to individually control the supply and cutoff and the flow rate of the $N_2$ gas supplied from the $N_2$ gas supply source 44 to the respective gas discharge holes 41 and 42.

Figure 5:
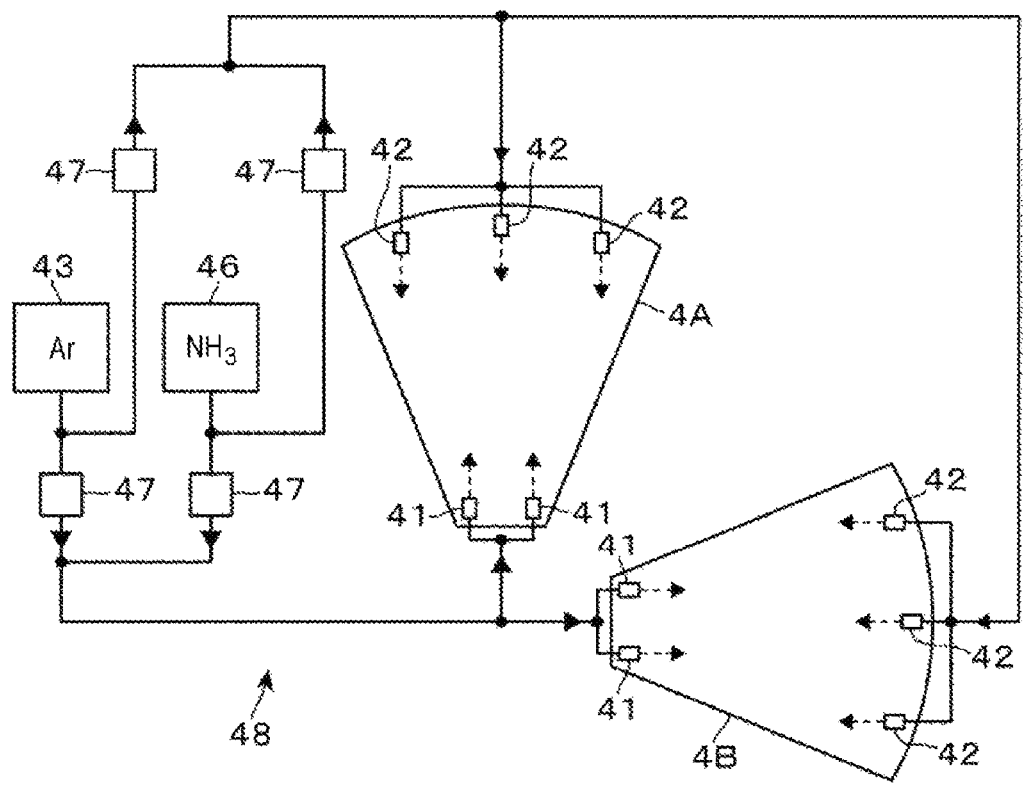
FIG. 5 is a schematic view of a gas supply unit installed in the film forming apparatus.

Next, the gas supply units 4A and 4B will be described with reference to FIG. 5 which is a schematic view. The gas supply unit 4A has substantially the same configuration as the plasma formation unit 3. However, in the gas supply unit 4A, the supply of the microwave to the antenna 31 is not performed. Thus, plasma is not formed under the gas supply unit 4A. The gas supply unit 4B has the same configuration as the gas supply unit 4A.

In the drawings, reference numeral 46 designates a supply source of an $NH_3$ (ammonia) gas. The first gas discharge holes 41 and the second gas discharge holes 42 of the gas supply units 4A and 4B are respectively connected to the Ar gas supply source 43 and the $NH_3$ gas supply source 46 via a pipe system 48 provided with gas supply instruments 47. The pipe system 48 is configured to individually control the supply and cutoff and the flow rate of the gas supplied from the Ar gas supply source 43 to the first gas discharge holes 41 of the gas supply units 4A and 4B, the supply and cutoff and the flow rate of the gas supplied from the $NH_3$ gas supply source 46 to the first gas discharge holes 41 of the gas supply units 4A and 4B, the supply and cutoff and the flow rate of the gas supplied from the Ar gas supply source 43 to the second gas discharge holes 42 of the gas supply units 4A and 4B, and the supply and cutoff and the flow rate of the gas supplied from the $NH_3$ gas supply source 46 to the second gas discharge holes 42 of the gas supply units 4A and 4B.

The plasma formation unit 3 and the gas supply units 4A and 4B will be additionally described. These units do not perform the supply and exhaust of the purge gas performed in the aforementioned gas supply/exhaust unit 2. Thus, in the film forming process, the respective atmospheres of the plasma formation region R2, the region under the gas supply unit 4A and the region under the gas supply unit 4B are not separated from each other. In addition, the regions above the rotary table 12 and under the gas supply units 4A and 4B constitute a second process part for supplying the NH₃ gas to the wafers W and causing the NH₃ gas to be physically adsorbed onto the wafers W.

Figure 2:
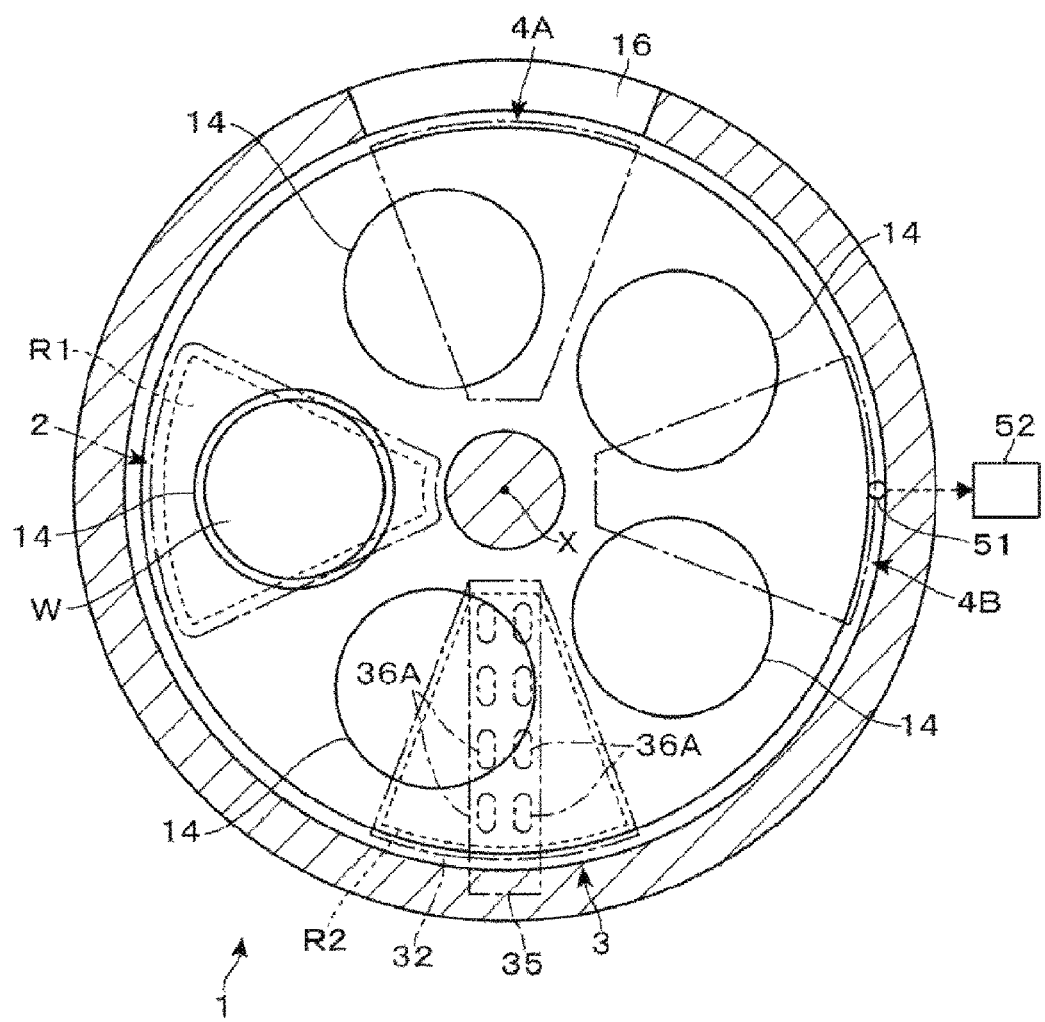
FIG. 2 is a horizontal sectional plane view of the film forming apparatus.

As illustrated in FIG. 2, an exhaust port 51 is formed in the bottom portion of the vacuum container 11 under the outer side of the rotary table 12. An exhaust device 52 is connected to the exhaust port 51. The exhaust amount from the exhaust port 51 by the exhaust device 52 is adjustable. A vacuum atmosphere of a pressure corresponding to the exhaust amount is formed within the vacuum container 11. The respective gases discharged from the gas supply units 4A and 4B are exhausted from the exhaust port 51. Furthermore, the gas discharged by the plasma formation unit 3, plasma-converted and then deactivated is also removed from the exhaust port 51.

As illustrated in FIG. 1, a control part 10 composed of a computer is installed in the film forming apparatus 1. A program is stored in the control part 10. In the program, a step group is incorporated so as to send a control signal to the respective parts of the film forming apparatus 1 and to control the operations of the respective parts so that the film forming process described later is performed. Specifically, the revolution number of the rotary table 12 rotated by the rotation mechanism 13, the flow rate and the supply and cutoff of the respective gases controlled by the respective gas supply instruments, the exhaust amounts of the respective gases exhausted by the exhaust devices 28 and 52, the supply and cutoff of the microwave supplied from the microwave generator 37 to the antenna 31, the supply of electric power to the heaters 15, and the like, are controlled by the program. The control of the supply of electric power to the heaters is the control of the temperature of the wafers W. The control of the exhaust amount by the exhaust device 52 is the control of the internal pressure of the vacuum container 11. The program is installed in the control part 10 from a recording medium such as a hard disk, a compact disk, a magneto-optical disk, a memory card or the like.

Figure 6:
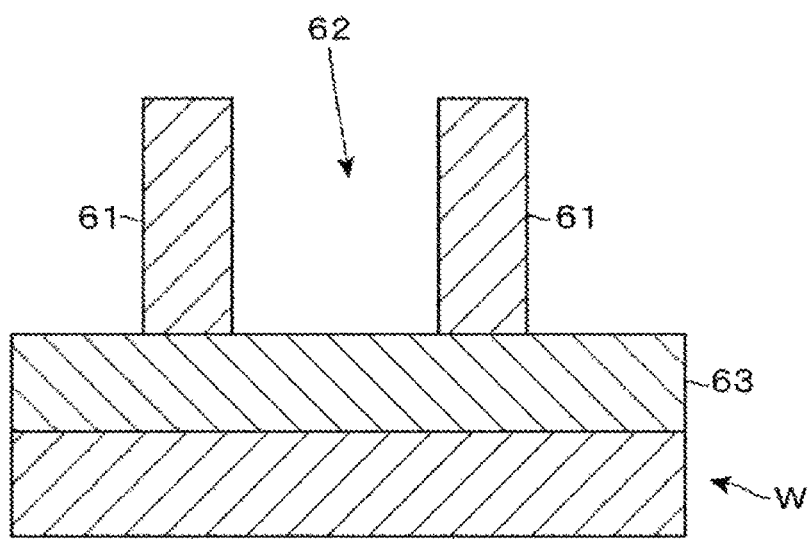
FIG. 6 is a pattern diagram illustrating a surface of a wafer under a film forming process.

Hereinafter, the film forming process performed by the film forming apparatus 1 will be described by appropriately referring to FIGS. 6 to 10 which are pattern diagrams of the vertical cross section of the wafer W. FIG. 6 illustrates the wafer W immediately prior to performing the film forming process. A carbon film 61 called a SOC film and mainly composed of carbon, which was described in the background section, is formed on the surface of the wafer W. That is to say, the carbon film 61 is exposed on the surface of the wafer W. A pattern 62 composed of a hole and a groove is formed in the carbon film 61. In the drawings, reference numeral 63 designates a lower film of the carbon film 61.

Five wafers W illustrated in FIG. 6 are transferred to the respective recess portions 14 of the rotary table 12 by the substrate transfer mechanism. Thereafter, the gate valve installed in the wafer transfer gate 16 is closed to keep the interior of the vacuum container 11 airtight. The wafers W mounted in the recess portions 14 are heated by the heaters 15 to a temperature at which ammonia supplied to the wafers W are physically adsorbed onto the wafers W as will be described later. This temperature may be, for example, 150 degrees C. to 650 degrees C., preferably 450 degrees C. to 650 degrees C. By the exhaust from the exhaust port 51, the interior of the vacuum container 11 is maintained in a vacuum atmosphere of a predetermined pressure and the rotary table 12 is rotated at, for example, 10 rpm to 30 rpm.

In the gas supply/exhaust unit 2, the DCS gas, which is a raw material gas, and the N₂ gas, which is a purge gas, are discharged from the gas discharge holes 21 and 23, respectively, at predetermined flow rates, and the exhaust is performed from the exhaust hole 22. In the plasma formation unit 3, the plasma-forming gas, which is a mixed gas of an N₂ gas and an Ar gas, is discharged from the first gas discharge holes 41 and the second gas discharge holes 42 at a predetermined flow rate. The microwave is supplied from the microwave generator 37, whereby plasma is generated in the plasma formation region R2. In the gas supply units 4A and 4B, a mixed gas of an NH₃ gas and an Ar gas is discharged from the gas discharge holes 41 and 42 at predetermined flow rates.

Figure 7:
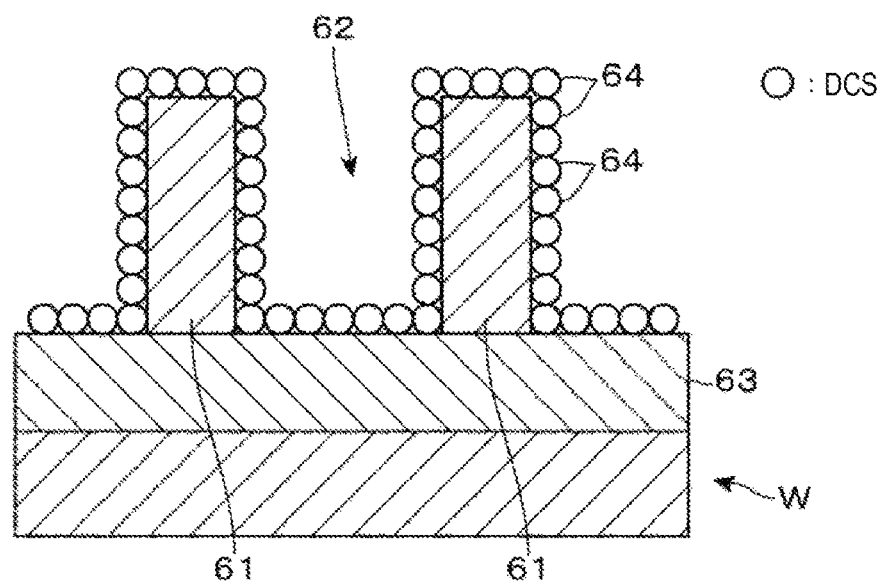
FIG. 7 is a pattern diagram illustrating a surface of a wafer under a film forming process.

If the wafer W is positioned in the raw material gas adsorption region R1 by the rotation of the rotary table 12, the silicon-containing raw material gas, for example, the DCS gas is supplied to and adsorbed onto the surface of the wafer W. In FIG. 7, the molecules of the DCS gas thus adsorbed are designated by reference numeral 64. As the rotary table 12 is continuously rotated, the wafer W is moved toward the outside of the raw material gas adsorption region R1. The purge gas is supplied to the surface of the wafer W, whereby the extra DCS gas adsorbed is removed.

Figure 8:
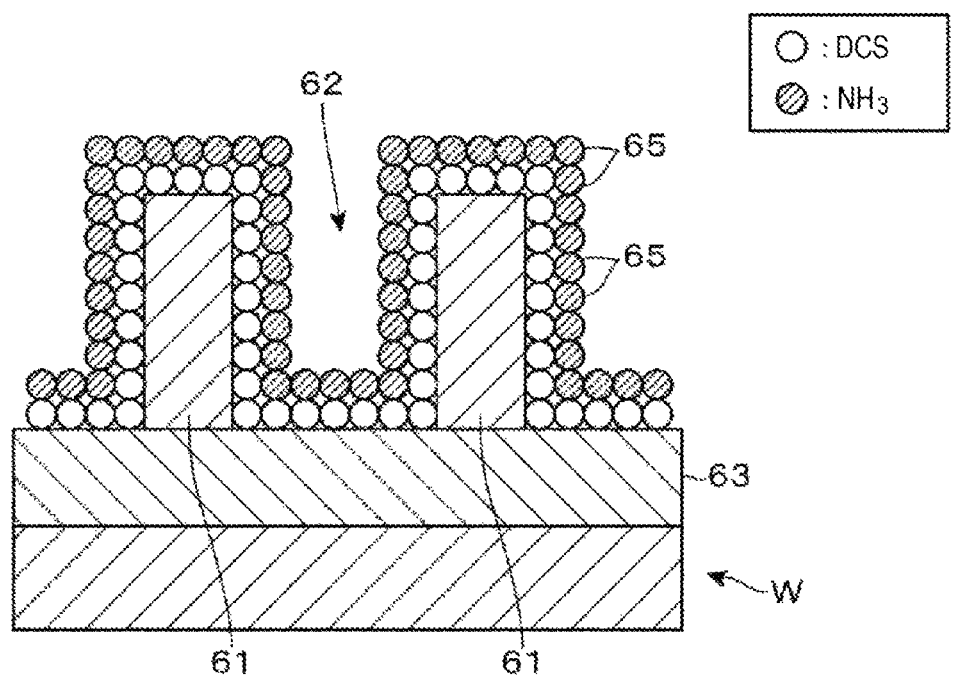
FIG. 8 is a pattern diagram illustrating a surface of a wafer under a film forming process.
Figure 9:
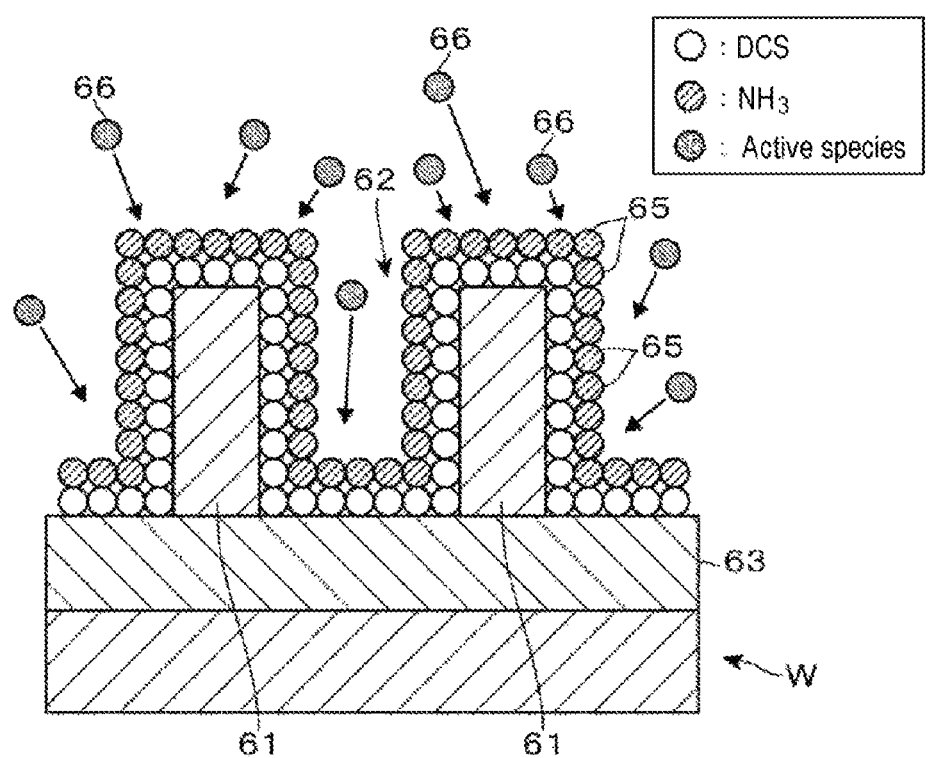
FIG. 9 is a pattern diagram illustrating a surface of a wafer under a film forming process.

Then, the wafer W moves to the outside of the raw material gas adsorption region R1 and sequentially passes through the region under the gas supply unit 4A and the region under the gas supply unit 4B. The NH₃ gas is supplied from the gas supply units 4A and 4B to the surface of the wafer W and the molecules of the NH₃ gas are physically adsorbed onto the surface of the wafer W. In FIG. 8, the molecules of the NH₃ gas thus physically adsorbed are designated by reference numeral 65. Since the plasma is restrictively formed in the plasma formation region R2 as described above, the NH₃ gas supplied to the wafer W at this time is not in a plasma-converted state.

Figure 10:
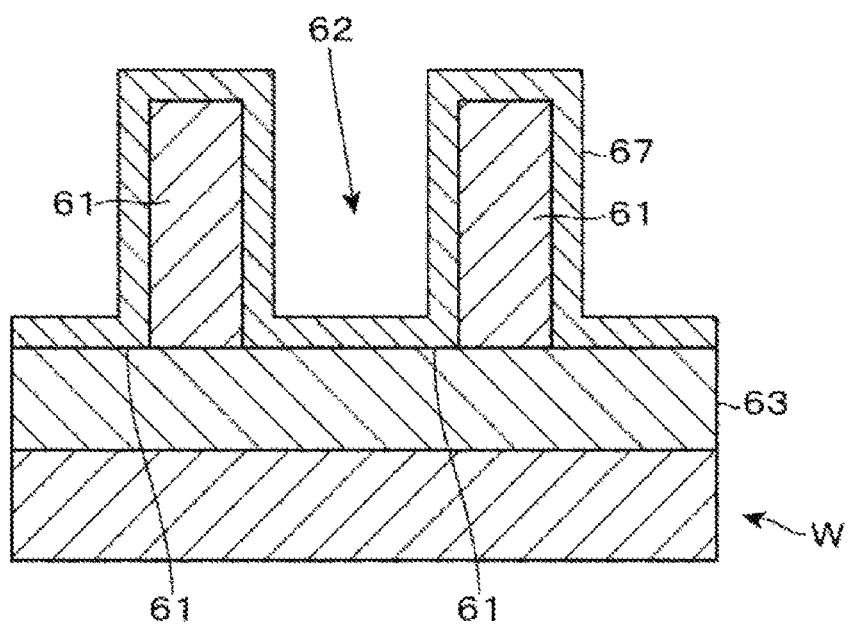
FIG. 10 is a pattern diagram illustrating a surface of a wafer under a film forming process.

If the wafer W is moved to the plasma formation region R2 as the rotary table 12 is further rotated, the active species (designated by reference numeral 66 in FIG. 9) of the gas, which constitute plasma, make contact with the surface of the wafer W. Thus, the NH₃ gas and the DCS gas physically adsorbed onto the wafer W react with each other. As illustrated in FIG. 10, a thin layer 67 composed of SiN is formed so as to cover the carbon film 61 formed on the surface of the wafer W.

As described above, NH₃ is physically adsorbed onto the wafer W. Thus, prior to the contact of the active species, a chemical reaction between NH₃ and DCS does not occur on the surface of the wafer W. Under the action of the active species supplied to the wafer W, energy is applied to the physically-adsorbed NH₃. Thus, the NH₃ reacts with DCS, whereby SiN is formed. The active species supplied to the surface of the wafer W in this way are the active species generated by the plasma conversion of the N₂ gas and the Ar gas supplied to the plasma formation region R2 as the plasma-forming gas. However, the active species of the NH₃ gas may be included in the aforementioned active species. In other words, the NH₃ gas supplied from the gas supply units 4A and 4B may enter the plasma formation region R2 and may be plasma-converted into active species. The active species may be supplied to the surface of the wafer W. Accordingly, in this case, the NH₃ gas also constitutes the plasma-forming gas.

Then, the rotary table 12 is rotated and the wafer W is moved from the plasma formation region R2 toward the raw material gas adsorption region R1 again. Thereafter, the wafer W is sequentially and repeatedly moved through the raw material gas adsorption region R1, the regions under the gas supply units 4A and 4B and the plasma formation region R2. Thus, a series of processes including the adsorption of the DCS gas, the physical adsorption of the NH₃ gas and the formation of the thin layer 67 of SiN by the supply of the active species generated from the plasma-forming gas are repeatedly performed with respect to the wafer W. The thin layers 67 thus formed are deposited. As the thin layers 67 are deposited in this way, an SiN film is formed and the thickness of the SiN film is increased.

If the SiN film having a desired film thickness is formed, for example, the discharge and exhaust of the respective gases in the gas supply/exhaust unit 2, the supply of the respective gases and the supply of the microwave in the plasma formation unit 3, and the discharge of the respective gases in the gas supply units 4A and 4B, are stopped to terminate the film forming process. The wafers W subjected to the film forming process are unloaded from the film forming apparatus 1 by the substrate transfer mechanism. For example, the shape of the SiN film thus formed is changed by etching after the film forming process and is used as a mask for etching the lower film 63.

In the film forming process performed by the film forming apparatus 1, the DCS gas is adsorbed onto the surface of the wafer W. Thereafter, the $NH_3$ gas not converted to plasma is physically adsorbed onto the wafer W. The surface of the wafer W is brought into contact with the active species generated from the plasma-forming gas. Thus, DCS and $NH_3$ are caused to react with each other, thereby forming the thin layer of SiN. The SiN film is formed by laminating the thin layer. Since the nitriding is performed by activating the physically-adsorbed $NH_3$ gas in this way, it is possible to prevent the wafer W from being exposed to an atmosphere in which a large amount of active species of the $NH_3$ gas exists. It is therefore possible to restrain the carbon film 61 from being etched and to restrain the thickness of the carbon film 61 from being reduced. As shown in the evaluation test described later, it was confirmed that the SiN film formed by this film forming process shows good coverage with respect to the carbon film 61. As compared with a process in which an SiN film is formed by setting the temperature of the wafer W at a temperature higher than 650 degrees C. and causing the DCS adsorbed onto the wafer W to chemically react with the $NH_3$ gas supplied to the wafer W, namely a process in which an SiN film is formed without resort to the action of active species, the process performed by the film forming apparatus 1 can improve the film quality of the SiN film. The improvement of the film quality means that the amount of an impurity existing in the film is small and the film has a dense structure. Presumably, this is because, when the active species act on the physically-adsorbed $NH_3$, the impurity existing on the surface of the wafer W is expelled and removed from the surface of the wafer W. By improving the film quality, it is possible to improve the shape of the SiN film during an etching process.

Since the SiN film is formed by the action described above, the plasma-forming gas supplied to the plasma formation region R2 in order to form the plasma and to generate the active species in the wafer W may be a mixed gas of an Ar gas and an $N_2$ gas as described in the aforementioned embodiment, or may be, for example, a mixed gas of an Ar gas and an $NH_3$ gas rather than the aforementioned gas. Moreover, it may be possible to use a helium (He) gas as the plasma-forming gas. The He gas alone may be used as the plasma-forming gas, or a mixed gas of the He gas and another gas may be used as the plasma-forming gas.

(Evaluation Test 1)

In evaluation test 1, a film forming process was performed with respect to the wafer W using the film forming apparatus 1 as described in the aforementioned embodiment. Process conditions used in this film forming process were as follows.

The temperature of the wafer W was 435 degrees C. The revolution number of the rotary table 12 was 30 rpm. The internal pressure of the vacuum container 11 was 267 Pa (2 Torr). The electric power supplied to the microwave generator 37 was 2500 W. The flow rates of the DCS gas supplied to the gas flow paths 25A, 25B and 25C of the gas supply/exhaust unit 2 were 55 sccm, 510 sccm and 145 sccm, respectively. While not described in the embodiment of the present disclosure, the gas flow path 25A of the gas supply/exhaust unit 2 is connected to an Ar gas supply source so that the gas can be stably discharged from the raw material gas discharge holes 21 even when the flow rate of the supplied DCS gas is relatively small. In this evaluation test, the Ar gas was supplied to the gas flow path 25A at 90 sccm. The mixed gas of the Ar gas and the DCS gas was discharged from the raw material gas discharge holes 21 connected to the gas flow path 25A.

As for the flow rates of the gases supplied to the first gas discharge holes 41 of the plasma formation unit 3, the flow rate of the Ar gas is 1667 sccm and the flow rate of the $N_2$ gas is 100 sccm. As for the flow rates of the gases supplied to the second gas discharge holes 42 of the plasma formation unit 3, the flow rate of the Ar gas is 1667 sccm and the flow rate of the $N_2$ gas is 100 sccm. As for the first gas discharge holes 41 of the gas supply units 4A and 4B, the Ar gas was supplied at 3333 sccm and the $NH_3$ gas was supplied at 60 sccm. In other words, the Ar gas supplied from the gas supply source 43 at 3333 sccm and the $NH_3$ gas supplied from the gas supply source 46 at 60 sccm were distributed to the first gas discharge holes 41 of the gas supply unit 4A and the first gas discharge holes 41 of the gas supply unit 4B, respectively.

As for the second gas discharge holes 42 of the gas supply units 4A and 4B, the Ar gas was supplied at 3333 sccm and the $NH_3$ gas was supplied at 1000 sccm. In other words, the Ar gas supplied from the gas supply source 43 at 3333 sccm and the $NH_3$ gas supplied from the gas supply source 46 at 1000 sccm were distributed to the second gas discharge holes 42 of the gas supply unit 4A and the second gas discharge holes 42 of the gas supply unit 4B, respectively.

Figure 11:
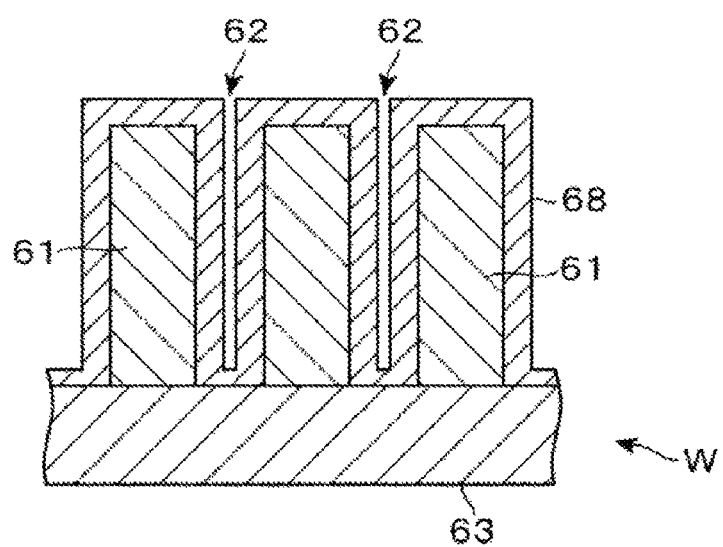
FIG. 11 is a schematic vertical sectional side view of a wafer processed in an evaluation test.

An image showing the vertical cross section of the wafer W subjected to the film forming process as described above was acquired by an SEM (Scanning Electron Microscope). FIG. 11 illustrates the acquired image as a pattern diagram. As illustrated in FIG. 11, the SiN film 68 having a relatively uniform thickness in the respective portions was formed on the carbon film 61. That is to say, the difference in the thickness of the SiN film 68 between the upper side and the lower side of the sidewall of the carbon film 61 which defines a pattern is suppressed. Furthermore, the carbon film 61 has a sufficient thickness. That is to say, the etching of the carbon film 61 is suppressed. The effects of the present disclosure were confirmed from this test result.

Next, comparative test 1 will be described. In comparative test 1, a film forming process was performed using the film forming apparatus 1 so that, instead of the mixed gas of the $NH_3$ gas and the Ar gas, the Ar gas alone is discharged from the gas supply units 4A and 4B. In comparative test 1, the film forming process was performed in the same manner as the aforementioned embodiment of the present disclosure except the difference in the kind of the discharged gas.

Figure 12:
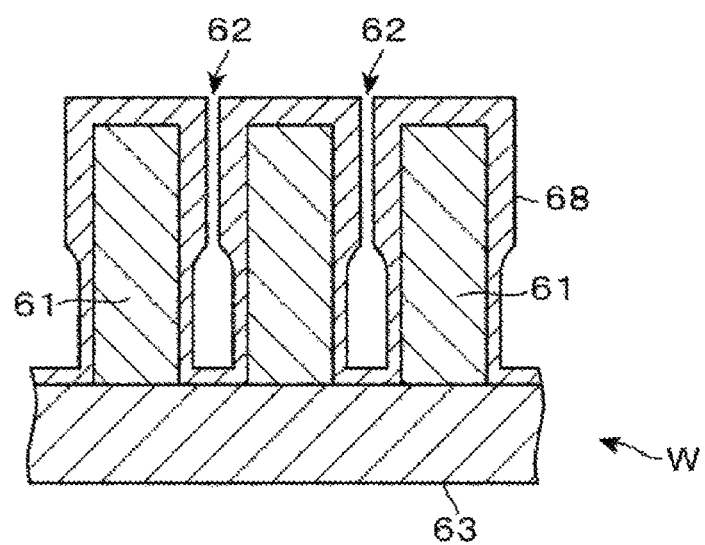
FIG. 12 is a schematic vertical sectional side view of a wafer processed in a comparative test.

FIG. 12 is a pattern diagram of the vertical cross section of the wafer W obtained by the film forming process of comparative test 1. As illustrated in FIG. 12, the thickness of the SiN film 68 formed at the lower side of the sidewall of the carbon film 61 is smaller than the thickness of the SiN film 68 formed at the upper side of the sidewall of the carbon film 61. As described in the summary section, the present disclosure was made to solve such a problem.

(Evaluation Test 2)

In evaluation test 2-1, the wafer W was accommodated within a test-purpose vacuum container. The temperature of the wafer W was set at 485 degrees C. Exhaust was performed so that the internal pressure of the vacuum container became 267 Pa (2 Torr). Formation of an SiN film by ALD was performed with respect to the wafer W accommodated within the vacuum container. Specifically, film formation was performed by repeating 200 times a cycle which performs the supply of a DCS gas, the supply of a purge gas, the supply of an $NH_3$ gas, the supply of a purge gas and the supply of a plasma-converted Ar gas in the named order. In one cycle, the supply of the purge gas between the supply of the $NH_3$ gas and the supply of the plasma-converted Ar gas was performed for 12 seconds. The supply of other gases was performed for 6 seconds. After the film formation, the film thickness of the wafer W was measured.

In evaluation test 2-2, a SiN film was formed on the wafer W under the same conditions as those of evaluation test 2-1 except that the supply time of the $NH_3$ gas in one cycle is changed to 30 seconds. The film thickness was measured. In evaluation test 2-3, a SiN film was formed on the wafer W under the same conditions as those of evaluation test 2-1 except that, instead of the supply of the plasma-converted Ar gas, the supply of an Ar gas not converted to plasma is performed. The film thickness was measured.

Figure 13:
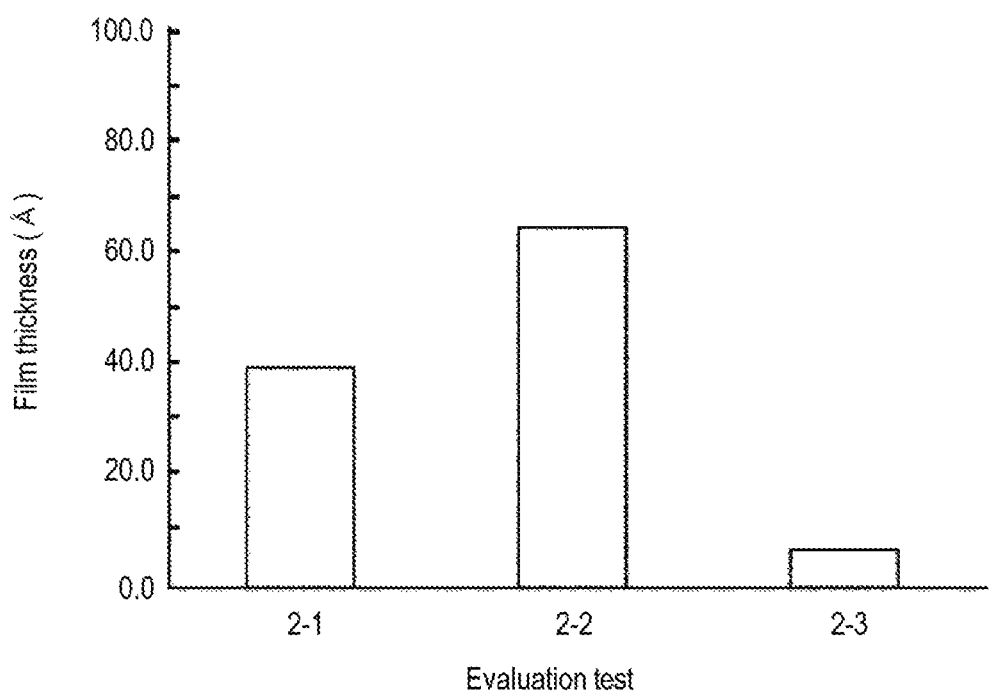
FIG. 13 is a graph illustrating a result of an evaluation test.

The bar graph of FIG. 13 shows the film thicknesses of the SiN films measured in evaluation tests 2-1, 2-2 and 2-3. The film thickness in evaluation test 2-1 was 39.0 Å. The film thickness in evaluation test 2-2 was 64.5 Å. The film thickness in evaluation test 2-3 was 6.3 Å. In evaluation test 2-2 in which the supply time of the $NH_3$ gas in one cycle is longer than that of evaluation test 2-1, the film thickness is large. Furthermore, in evaluation test 2-3 in which the supply of the active species of plasma is not performed, the film thickness is smaller than that of evaluation tests 2-1 and 2-2 in which the supply of the active species of plasma is performed. From the result of evaluation test 2, it is presumed that, as described in the embodiment of the present disclosure, the $NH_3$ gas supplied to the wafer W does not make a chemical reaction with the DCS of the surface of the wafer W but remains in a physically-adsorbed state. It is also presumed that the chemical reaction is generated by the action of the active species of plasma and the film formation is performed.

(Evaluation Test 3)

In evaluation test 3, an SiN film forming process was performed multiple times with respect to the wafer W using the film forming apparatus 1 described in the embodiment of the present disclosure. In the respective film forming processes, the temperature of the wafer W was set at 450 degrees C., the internal pressure of the vacuum container 11 was set at 267 Pa (2 Torr), and the output of the microwave generator 37 was set at 2500 W. In the respective film forming processes, as the plasma-forming gas, a mixed gas of an $NH_3$ gas and another gas was supplied to the plasma formation region R2. Another gas was changed for each film forming process. Specifically, an Ar gas or a He gas was used as another gas. The flow rate of the $NH_3$ gas was set at 750 sccm and the flow rate of another gas was set at 4000 sccm.

After the film formation, one of the wafers W subjected to the film formation using the Ar gas as another gas was etched without going through an annealing process. Another wafer W was etched after going through an annealing process. Among the tests conducted using the Ar gas in this way, the test not going through the annealing process will be referred to as evaluation test 3-1 and the test going through the annealing process will be referred to as evaluation test 3-2. One of the wafers W subjected to the film formation using the He gas as another gas was etched without going through an annealing process. Another wafer W was etched after going through an annealing process. Among the tests conducted using the He gas in this way, the test not going through the annealing process will be referred to as evaluation test 3-3 and the test going through the annealing process will be referred to as evaluation test 3-4. Etching rates were examined with respect to the wafers W etched in evaluation tests 3-1 to 3-4. As the etching rate grows lower, the film quality of the SiN film thus formed becomes better.

The etching rate of evaluation test 3-1 was 7.4 Å/min, the etching rate of evaluation test 3-2 was 3.2 Å/min, the etching rate of evaluation test 3-3 was 7.5 Å/min, and the etching rate of evaluation test 3-4 was 3.8 Å/min. From this result, it was found that film formation can be performed either in the case where the mixed gas of the He gas and the $NH_3$ gas is used as the plasma-forming gas or in the case where the mixed gas of the Ar gas and the $NH_3$ gas is used as the plasma-forming gas. However, it was found that a film having a better film quality can be formed by using the mixed gas of the Ar gas and the $NH_3$ gas as the plasma-forming gas.

According to the present disclosure in some embodiments, after the silicon raw material gas is adsorbed onto the substrate, the ammonia gas is supplied to the substrate without plasma-converting the same and is physically adsorbed onto the substrate. Thereafter, the silicon nitride film is formed by supplying the active species of plasma to the substrate. By forming the silicon nitride film in this way, it is possible to form the silicon nitride film on the surface of the substrate with relatively high coverage and to suppress damage to the surface of the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A film forming method for forming a silicon nitride film on a substrate within a vacuum container, comprising:
   a first process of supplying a gas of a silicon raw material to the substrate to cause the silicon raw material gas to be adsorbed onto the substrate;
   a second process of subsequently supplying an ammonia gas to the substrate in a non-plasma-converted state to cause the ammonia gas to be physically adsorbed onto the substrate;
   a third process of subsequently supplying a purge gas to the substrate when the ammonia gas is physically adsorbed onto the substrate;
   a fourth process of subsequently supplying active species obtained by plasma-converting a plasma-forming gas for forming plasma to the substrate, thereby causing ammonia physically adsorbed onto the substrate to react with the silicon raw material to form a reaction product layer; and forming the silicon nitride film by depositing the reaction product layer by repeating multiple times a cycle including the first process, the second process, the third process and the fourth process.

2. The method of claim 1, wherein the active species includes active species of at least one of a nitrogen gas, an ammonia gas and a helium gas.

3. The method of claim 2, wherein the supplying active species to the substrate includes plasma-converting at least one of the nitrogen gas and the ammonia gas and an argon gas.

4. The method of claim 1, wherein the silicon nitride film is formed on the substrate having a pattern of a carbon film exposed from a surface of the substrate, so as to cover the carbon film.

5. The method of claim 1, wherein the second process includes heating the substrate to 150 degrees C. to 650 degrees C. in order to cause the ammonia gas to be physically adsorbed onto the substrate.

6. The method of claim 1, further comprising:

mounting the substrate on a rotary table installed within the vacuum container and causing the substrate to be revolved, wherein the first process includes supplying the gas of the silicon raw material to a first process part in a substrate passage region on the rotary table, the second process includes supplying the ammonia gas in the non-plasma-converted state to a second process part positioned at a rotational direction downstream side of the rotary table with respect to the first process part in the substrate passage region, the third process includes supplying the purge gas to the second process part, the fourth process includes supplying the active species to a third process part positioned at a rotational direction downstream side of the rotary table with respect to the second process part in the substrate passage region, and the method further comprises separating the second process part and the third process part from the first process part in order to restrain the gases from being mixed with each other.

7. A film forming apparatus for forming a silicon nitride film on a substrate, comprising:

a rotary table installed within a vacuum container and configured to revolve the substrate;

a first process part configured to supply a gas of a silicon raw material to a substrate passage region on the rotary table;

a second process part positioned at a rotational direction downstream side of the rotary table with respect to the first process part and separated from the first process part in order to restrain gases from being mixed with each other, the second process part configured to supply an ammonia gas in a non-plasma-converted state to the substrate passage region, configured to cause the ammonia gas to be physically adsorbed onto the substrate and configured to supply a purge gas to the substrate when the ammonia gas is physically absorbed onto the substrate; and a third process part positioned at a rotational direction downstream side of the rotary table with respect to the second process part and separated from the first process part in order to restrain gases from being mixed with each other, the third process part configured to supply active species obtained by plasma-converting a plasma-forming gas for forming plasma to the substrate passage region.

* * * * *